(12) United States Patent
Son et al.

(10) Patent No.: US 10,996,803 B2
(45) Date of Patent: May 4, 2021

(54) DISPLAY DEVICE

(71) Applicant: LG DISPLAY CO., LTD., Seoul (KR)

(72) Inventors: YoungHoon Son, Paju-si (KR);
Seogshin Kang, Seoul (KR); JiYoung Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 120 days.

(21) Appl. No.: 15/685,492

(22) Filed: Aug. 24, 2017

(65) Prior Publication Data
US 2018/0188837 A1    Jul. 5, 2018

(30) Foreign Application Priority Data

Dec. 29, 2016   (KR) .................. 10-2016-0182401

(51) Int. Cl.
*G06F 3/044*    (2006.01)
*G09G 3/14*     (2006.01)
*G06F 3/041*    (2006.01)
*H01L 27/32*    (2006.01)
*H01L 51/52*    (2006.01)
*G06F 3/0354*   (2013.01)

(52) U.S. Cl.
CPC ........ *G06F 3/0443* (2019.05); *G06F 3/03547* (2013.01); *G06F 3/0412* (2013.01); *G09G 3/14* (2013.01); *H01L 27/323* (2013.01); *H01L 27/3246* (2013.01); *H01L 51/5225* (2013.01); *G06F 2203/04103* (2013.01); *H01L 27/322* (2013.01); *H01L 51/5284* (2013.01)

(58) Field of Classification Search
CPC .. G06F 3/0443; G06F 3/03547; G06F 3/0412; G06F 2203/04103; G06F 3/044; H01L 27/323; H01L 27/3246; H01L 51/5225; H01L 27/322; H01L 51/5284; G09G 3/14
See application file for complete search history.

(56) References Cited

U.S. PATENT DOCUMENTS

2005/0067946 A1   3/2005   Park
2009/0201230 A1   8/2009   Smith
(Continued)

FOREIGN PATENT DOCUMENTS

| JP | 2005-520302 A | 7/2005 |
| JP | 2009-543104 A | 12/2009 |
| JP | 2015-62195 A | 4/2015 |

*Primary Examiner* — Patrick N Edouard
*Assistant Examiner* — Douglas M Wilson
(74) *Attorney, Agent, or Firm* — Birch, Stewart, Kolasch & Birch LLP

(57) ABSTRACT

A display device according to an embodiment includes a substrate including a plurality of pixels including a first pixel and a second pixel, a light emitting device layer provided on the substrate and including an anode included in each of the first pixel and the second pixel, a first bank layer in a boundary between the first pixel and the second pixel, a light emitting layer on the anode, and a cathode on the light emitting layer, an encapsulation layer provided on the light emitting device layer, and a touch sensor provided on the encapsulation layer. The cathode includes a first cathode included in the first pixel and a second cathode included in the second pixel, and the first cathode and the second cathode are separated from each other by the first bank layer.

6 Claims, 8 Drawing Sheets

(56) References Cited

U.S. PATENT DOCUMENTS

| | | | |
|---|---|---|---|
| 2013/0250557 A1* | 9/2013 | Sugizaki | H01L 51/5212 |
| | | | 362/157 |
| 2016/0104752 A1* | 4/2016 | Oh | H01L 27/3232 |
| | | | 257/40 |
| 2016/0260780 A1 | 9/2016 | Kim et al. | |
| 2016/0299611 A1 | 10/2016 | Park | |
| 2017/0278915 A1* | 9/2017 | Jung | H01L 51/524 |
| 2017/0329452 A1* | 11/2017 | Liu | G02F 1/1368 |
| 2017/0345881 A1* | 11/2017 | Kim | H01L 27/3248 |
| 2017/0358631 A1* | 12/2017 | Miyamoto | H01L 27/323 |
| 2018/0342561 A1* | 11/2018 | Yamazaki | H01L 27/322 |
| 2018/0358559 A1* | 12/2018 | Jeong | H01L 51/0012 |
| 2018/0364847 A1* | 12/2018 | Xiong | G06F 3/0443 |
| 2019/0319077 A1* | 10/2019 | Miyamoto | G06F 3/0446 |

\* cited by examiner

DISPLAY DEVICE

CROSS-REFERENCE TO RELATED APPLICATIONS

This application claims the priority benefit of the Korean Patent Application No. 10-2016-0182401 filed on Dec. 29, 2016, which is hereby incorporated by reference as if fully set forth herein.

BACKGROUND

Field of the Invention

The present invention relates to a display device, and more particularly, to a display device including a touch sensor.

Discussion of the Related Art

Electroluminescent display devices are devices which have a structure where a light emitting layer is provided between two electrodes, and thus, emit light with an electric field between the two electrodes to display an image.

The light emitting layer may be formed of an organic material which emits light when an exciton generated by a combination of an electron and a hole is shifted from an excited state to a ground state. Alternatively, the light emitting layer may be formed of an inorganic material such as a quantum dot.

In the electroluminescent display devices, a mouse or a keyboard is generally used as an input means, but a touch sensor that enables a user to directly input information with a finger or a pen is being mainly applied to navigation devices, portable terminals, home appliances, etc.

Hereinafter, a related art electroluminescent display device including a touch sensor will be described with reference to FIG. 1.

FIG. 1 is a schematic cross-sectional view of a related art electroluminescent display device.

As seen in FIG. 1, the related art electroluminescent display device includes a substrate 10, a circuit device layer 20, a light emitting device layer 30, an encapsulation layer 40, and a touch sensor 50.

The circuit device layer 20 is formed on the substrate 10. Various lines, thin film transistors (TFTs) such as a switching TFT and a driving TFT, and a capacitor are provided in the circuit device layer 20.

The light emitting device layer 30 is formed on the circuit device layer 20. The light emitting device layer 30 includes an anode 31, a bank layer 32, a light emitting layer 33, and a cathode 34.

The anode 31 is patterned and provided in each of a plurality of pixels. The bank layer 32 is provided in a matrix structure to define a pixel area. The light emitting layer 33 is formed on the anode 31. The cathode 34 is formed on the light emitting layer 33. The cathode 34 functions as a common electrode in the plurality of pixels, and thus, is formed all over the substrate 10.

The encapsulation layer 40 is formed on the light emitting device layer 30. The encapsulation layer 40 prevents external water or oxygen from penetrating into the light emitting layer 33 of the light emitting device layer 30, thereby preventing the light emitting device layer 30 from being deteriorated.

The touch sensor 50 is formed on the encapsulation layer 40. The touch sensor 50 includes a plurality of touch electrodes for sensing a user touch.

However, in the related art electroluminescent display device, a parasitic capacitance C is generated between each of the plurality of touch electrodes included in the touch sensor 50 and the cathode 34 included in the light emitting device layer 30, and for this reason, a performance of the touch sensor 50 is degraded.

SUMMARY

Accordingly, the present invention is directed to provide a display device that substantially obviates one or more problems due to limitations and disadvantages of the related art.

An aspect of the present invention is directed to provide a display device which decreases a parasitic capacitance generated between each of a plurality of touch electrodes included in a touch sensor and a cathode included in a light emitting device layer, thereby preventing a performance of the touch sensor from being degraded.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display device including a substrate including a plurality of pixels including a first pixel and a second pixel, a light emitting device layer provided on the substrate and including an anode included in each of the first pixel and the second pixel, a first bank layer in a boundary between the first pixel and the second pixel, a light emitting layer on the anode, and a cathode on the light emitting layer, an encapsulation layer provided on the light emitting device layer, and a touch sensor provided on the encapsulation layer, wherein the cathode includes a first cathode included in the first pixel and a second cathode included in the second pixel, and the first cathode and the second cathode are separated from each other by the first bank layer.

In another aspect of the present invention, there is provided a display device including a substrate, an insulation layer provided on the substrate, a light emitting device layer contacting one surface of the insulation layer, a touch sensor contacting another surface of the insulation layer, and a cathode provided in the light emitting device layer to contact a portion of the one surface of the insulation layer, wherein a distance from the cathode to the touch sensor is longer than a distance from another portion of the one surface of the insulation layer, which does not contact the cathode, to the touch sensor.

In another aspect of the present invention, there is provided a display device including a substrate including a plurality of pixels, a light emitting device layer provided on the substrate and including an anode, a bank layer, a light emitting layer, and a cathode; and a touch sensor provided on the light emitting device layer to face the cathode, wherein the cathode does not extend to a top of at least a portion of the bank layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
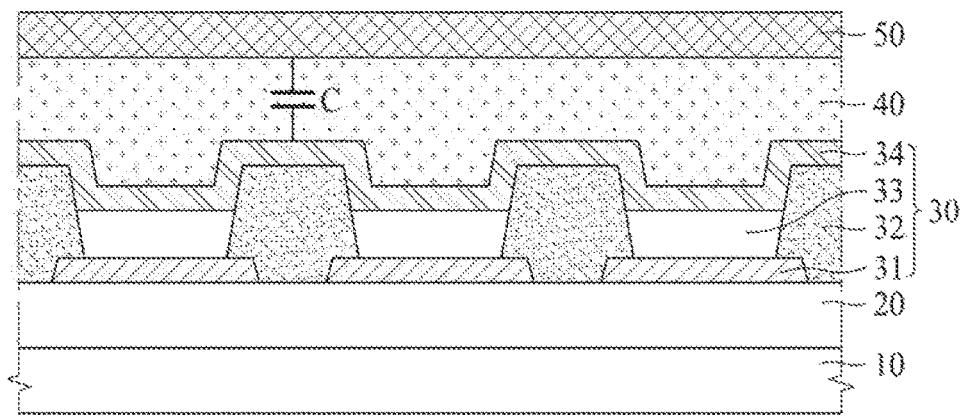
FIG. 1 is a schematic cross-sectional view of a related art electroluminescent display device.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted or brief. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 2:
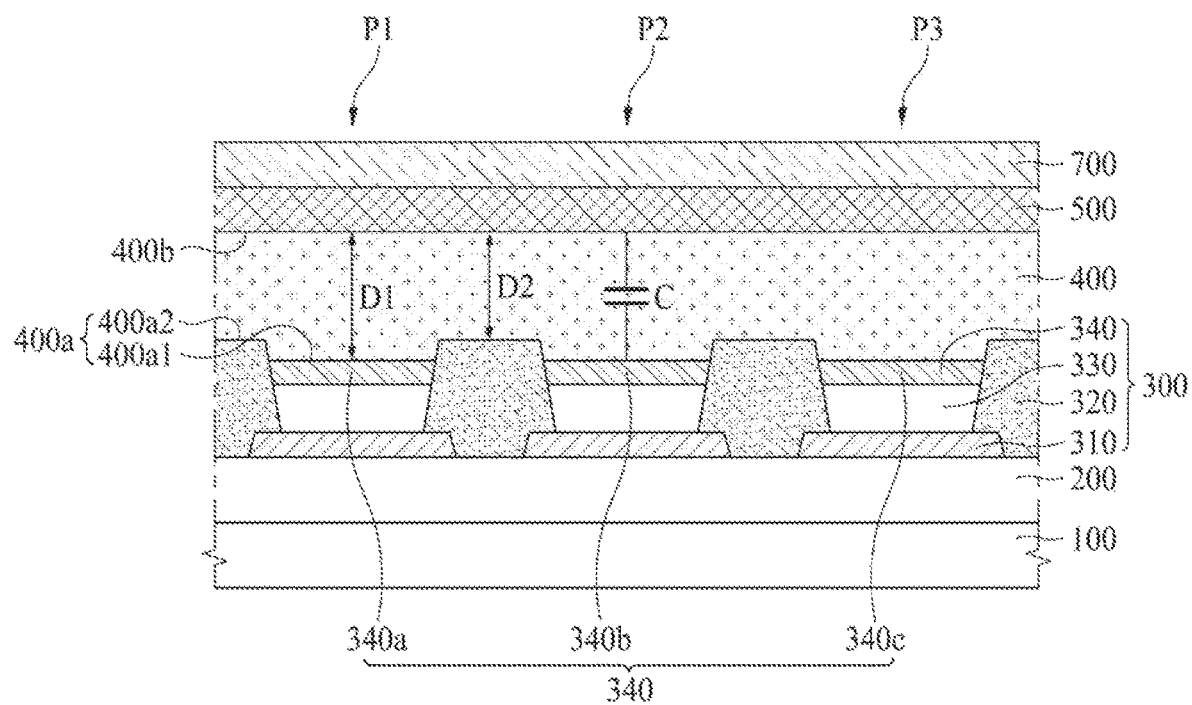
FIG. 2 is a schematic cross-sectional view of a display device according to an embodiment of the present invention.

FIG. 2 is a schematic cross-sectional view of a display device according to an embodiment of the present invention. All the components of the display device according to all embodiments of the present invention are operatively coupled and configured.

As seen in FIG. 2, the display device according to an embodiment of the present invention may include a substrate 100, a circuit device layer 200, a light emitting device layer 300, an encapsulation layer 400, a touch sensor 500, and a cover film 700.

The substrate 100 may use glass or transparent plastic (for example, polyimide or the like) capable of being curved or bent, but is not limited thereto.

The circuit device layer 200 may be formed on the substrate 100. The circuit device layer 200 may include a plurality of lines, and a thin film transistor (TFT) and a capacitor which are electrically connected to the plurality of lines. The plurality of lines may include a gate line, a data line, and a power line. The TFT may include a switching TFT, a driving TFT, and a sensing TFT. A detailed configuration of the circuit device layer 200 may be modified into various types well known to those skilled in the art.

The light emitting device layer 300 may be formed on the circuit device layer 200.

The light emitting device layer 300 may include an anode 310, a bank layer 320, a light emitting layer 330, and a cathode 340.

The anode 310 may be patterned and formed in each of a plurality of pixels P1 to P3 on the circuit device layer 200. The anode 310 may be formed of a reflective electrode, and thus, light emitted from the light emitting layer 330 may be reflected by the anode 310 and may be output to the outside through the cover film 700. The anode 310 formed of the reflective electrode may include a reflective layer formed on the circuit device layer 200 and a transparent conductive layer formed on the reflective layer, but is not limited thereto.

The bank layer 320 may be formed on the circuit device layer 200 to cover an end of the anode 310. The bank layer 320 may be patterned and formed in a matrix structure to define a plurality of pixel (P1 to P3) areas. Therefore, the bank layer 320 may be formed in a boundary between the pixel (P1 to P3) areas.

The light emitting layer 330 may be formed on the anode 310. The light emitting layer 330 may include a red light emitting layer, a green light emitting layer, and a blue light emitting layer which are patterned and formed in the respective pixels P1 to P3. The light emitting layer 330 may include a hole injection layer, a hole transport layer, an organic light emitting layer, an electron transport layer, and an electron injection layer, but is not limited thereto. Depending on the case, the light emitting layer 330 may be formed of an inorganic material such as a quantum dot or the like.

The cathode 340 may be formed on the light emitting layer 330. The cathode 340 may be formed of a transparent conductive material or a semitransparent conductive material.

The cathode 340 may not be formed all over the substrate 100 but may be patterned and formed in a certain type on the substrate 100. For example, the cathode 340 may include a first cathode 340a included in a first pixel P1, a second cathode 340b included in a second pixel P2, and a third cathode 340c included in a third pixel P3.

The first cathode 340a, the second cathode 340b, and the third cathode 340c may be separated from each other by the bank layer 320. Also, the first cathode 340a, the second cathode 340b, and the third cathode 340c may not be formed on a top of the bank layer 320.

That is, the first cathode 340a, the second cathode 340b, and the third cathode 340c may not extend to the top of the bank layer 320, and thus, an end of each of the first cathode 340a, the second cathode 340b, and the third cathode 340c may face a side surface of the bank layer 320.

The same voltage may be applied to the first cathode 340a, the second cathode 340b, and the third cathode 340c, and in this case, the first cathode 340a, the second cathode 340b, and the third cathode 340c may be electrically connected to each other. An electrical connection between the first cathode 340a, the second cathode 340b, and the third cathode 340c may be made in an edge area of the substrate 100. This can be easily understood with reference to FIGS. 5 to 8 to be described below.

The encapsulation layer 400 may be formed on the light emitting device layer 300.

The encapsulation layer 400 prevents external water or oxygen from penetrating into the light emitting device layer 300, thereby preventing the light emitting device layer 300 from being deteriorated. The encapsulation layer 400 may be formed of an insulating material.

The touch sensor 500 may be formed on the encapsulation layer 400 and may face the cathode 340 of the light emitting device layer 300 with the encapsulation layer 400 therebetween.

The touch sensor 500 may include a plurality of touch electrodes for sensing a user touch. The touch sensor 500 may be formed in a mutual capacitance type, but is not limited thereto. The touch sensor 500 may be modified into various types well known to those skilled in the art.

The cover film 700 may be formed on the touch sensor 500. The cover film 700 may be formed on a surface on which an image is displayed, and prevents a scratch from occurring in a screen and protects the display device from an external impact.

According to an embodiment of the present invention, the cathode 340 included in the light emitting device layer 300 may include the first cathode 340a, the second cathode 340b, and the third cathode 340c separated from each other by the bank layer 320 and may be patterned and formed. Accordingly, according to an embodiment of the present invention, in comparison with the related art where the cathode 34 is formed all over the substrate 10, an area of the cathode 340 is reduced, and thus, a parasitic capacitance C generated between each of the plurality of touch electrodes included in the touch sensor 500 and the cathode 340 is reduced.

Moreover, according to an embodiment of the present invention, since the first cathode 340a, the second cathode 340b, and the third cathode 340c do not extend to a top of the bank 320, in comparison with the related art, a distance between the touch sensor 500 and the cathode 340 increases, and thus, a parasitic capacitance generated between each of the plurality of touch electrodes included in the touch sensor 500 and the cathode 340 is reduced.

In other words, according to an embodiment of the present invention, the light emitting device layer 300 may contact one surface 400a of the encapsulation layer 400 including an insulating material, and the touch sensor 500 may contact another surface 400b of the encapsulation layer 400. In this case, the cathode 340 included in the light emitting device layer 300 may contact one portion 400a1 of the one surface 400a of the encapsulation layer 400, and another portion 400a2 of the one surface 400a of the encapsulation layer 400 may contact the bank layer 320 of the light emitting device layer 300 without contacting the cathode 340.

Accordingly, a distance D1 from the cathode 340 to the touch sensor 500 is longer than a distance D2 from the other portion 400a2 of the one surface 400a of the encapsulation layer 400 to the touch sensor 500, and thus, in comparison with the related art, a parasitic capacitance between the cathode 340 and the touch sensor 500 is reduced.

Figure 3:
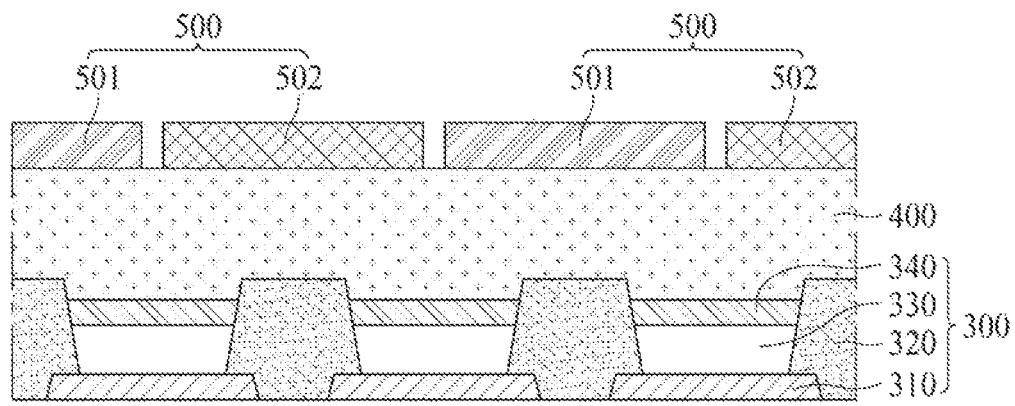
FIG. 3 is a schematic cross-sectional view illustrating a touch electrode configuring a touch sensor according to an embodiment of the present invention.
Figure 4:
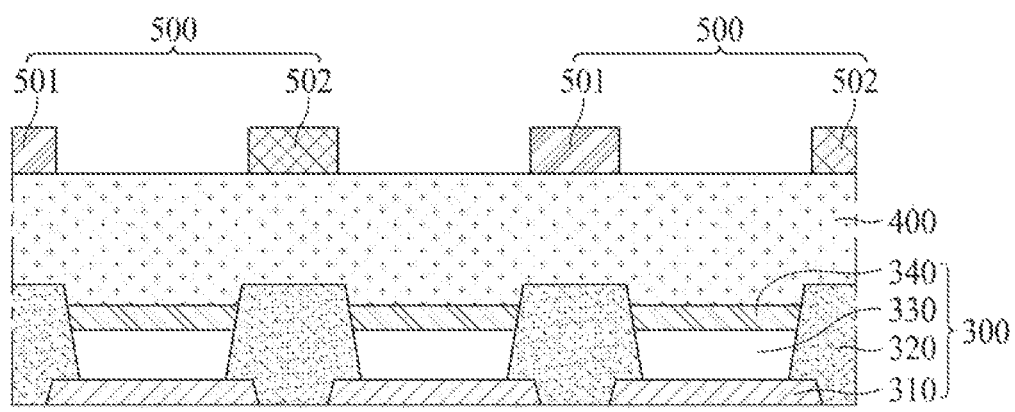
FIG. 4 is a schematic cross-sectional view illustrating a touch electrode configuring a touch sensor according to another embodiment of the present invention.
Figure 5:
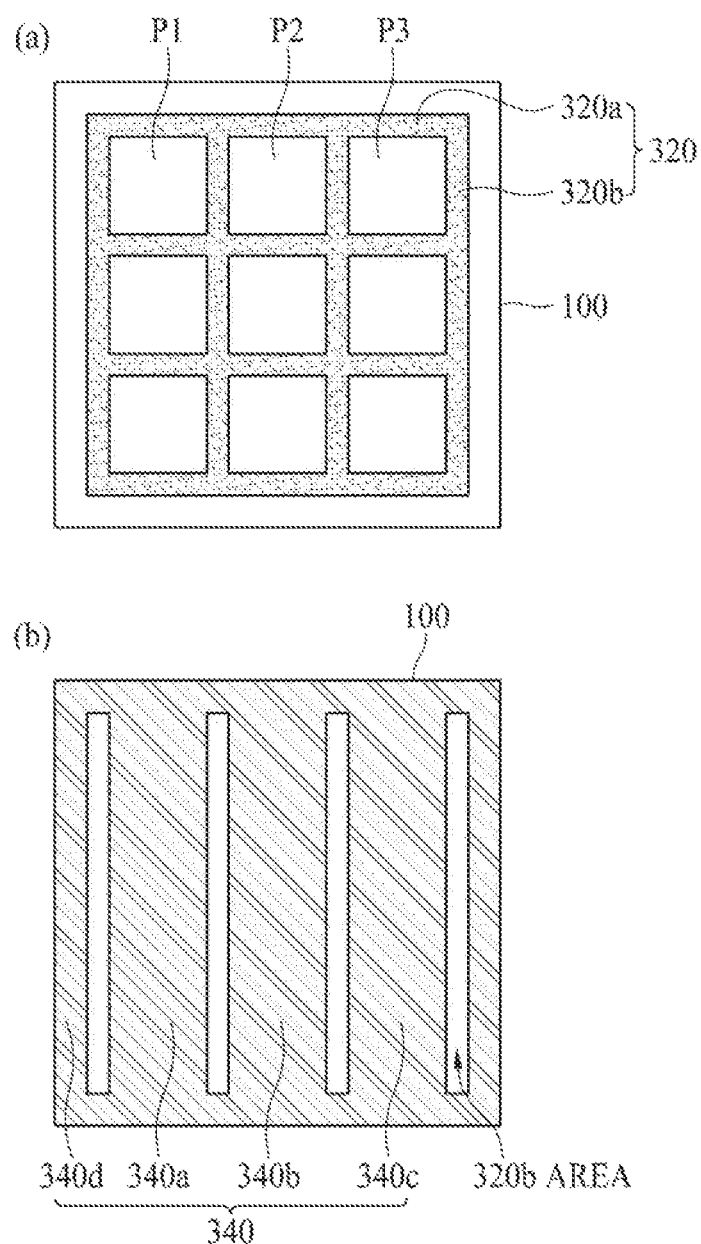
FIGS. 5 to 8 are schematic plan views illustrating a structure of each of a bank layer and a cathode according to various embodiments of the present invention.
Figure 6:
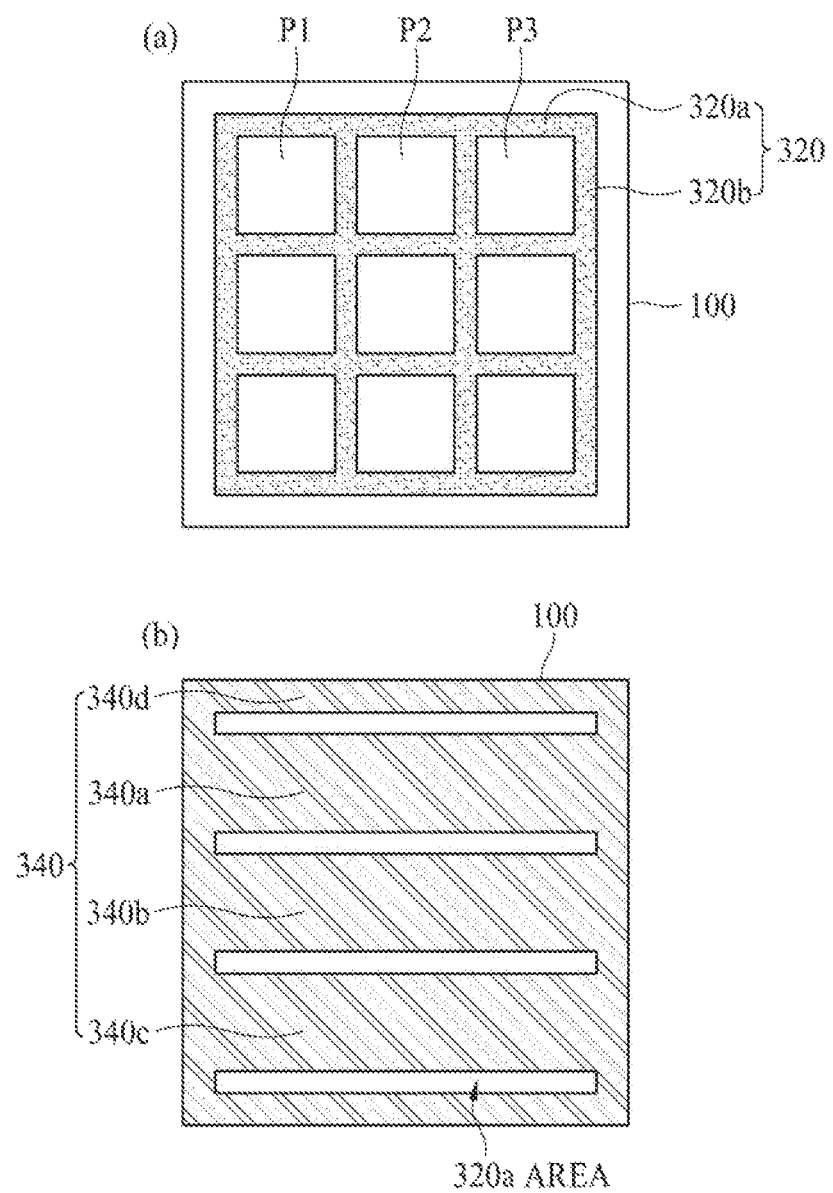
Figure 7:
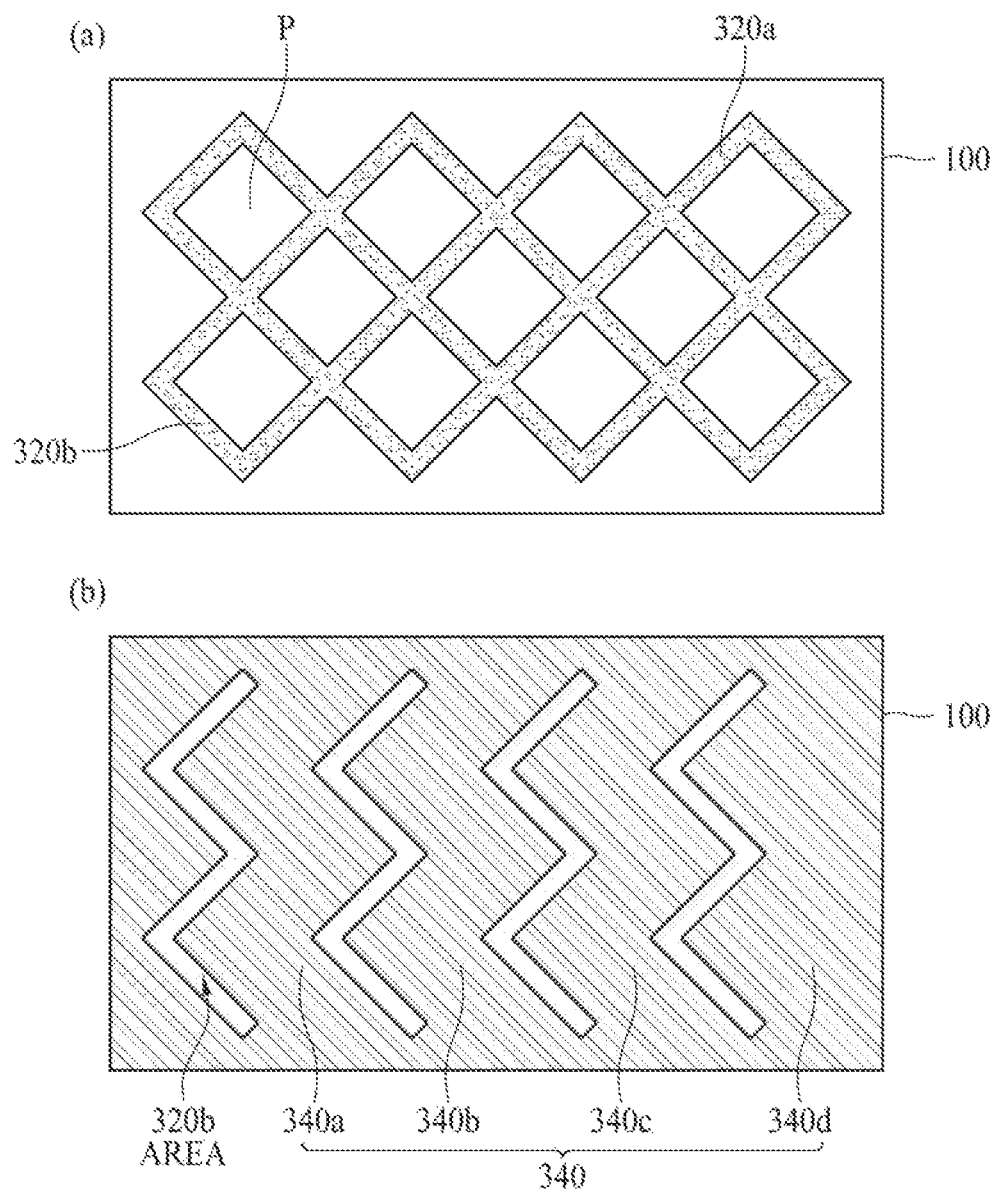
Figure 8:
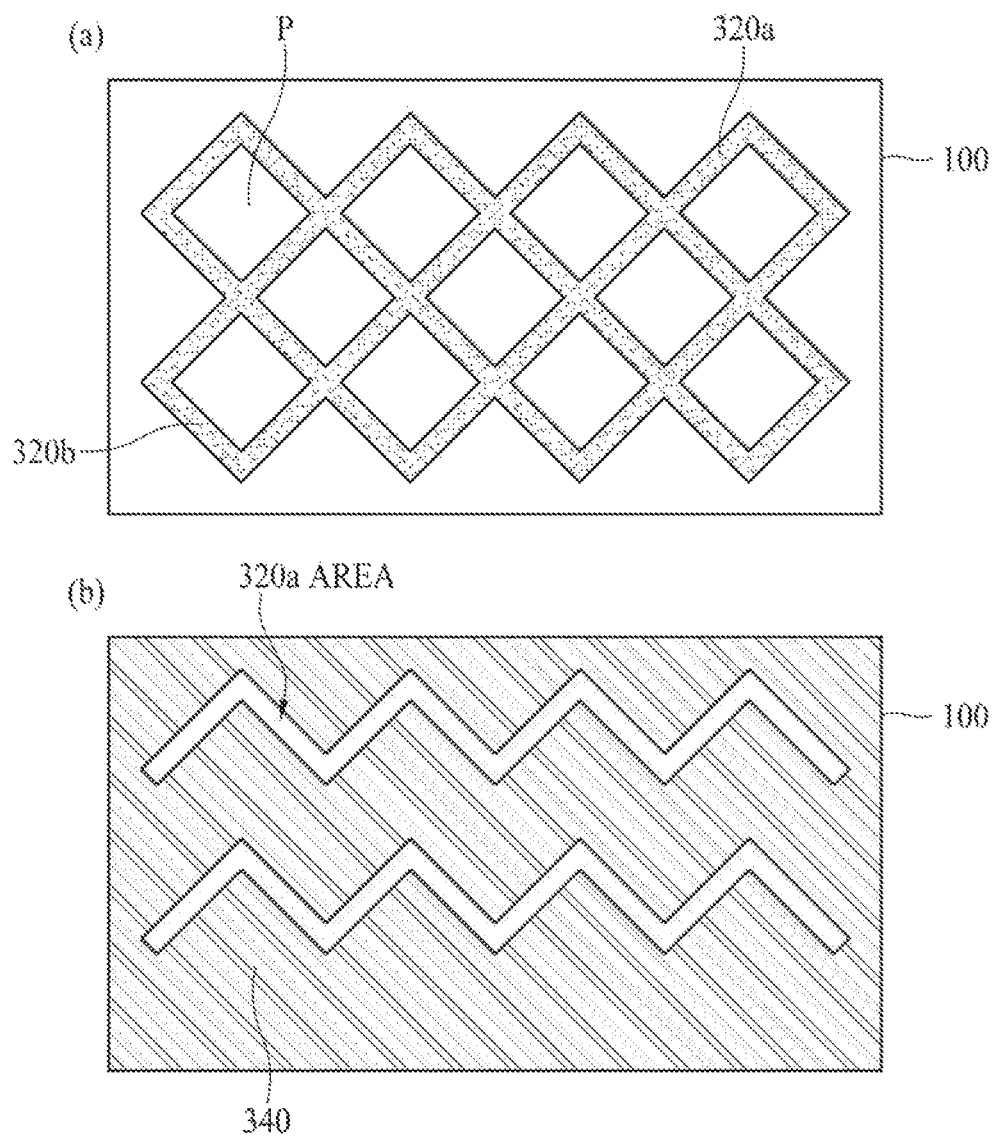

FIG. 3 is a schematic cross-sectional view illustrating a plurality of touch electrodes 501 and 502 configuring a touch sensor 500 according to an embodiment of the present invention. FIG. 4 is a schematic cross-sectional view illustrating a plurality of touch electrodes 501 and 502 configuring a touch sensor 500 according to another embodiment of the present invention.

In FIGS. 3 and 4, for convenience, the substrate 100, the circuit device layer 200, and the cover film 700 of FIG. 2 may not be illustrated, and only a light emitting device layer 300, an encapsulation layer 400, and a touch sensor 500 are illustrated. Configurations of the light emitting device layer 300 and the encapsulation layer 400 are as described above with reference to FIG. 2, and thus, their repetitive descriptions are not provided.

As seen in FIG. 3, the touch sensor 500 formed on the encapsulation layer 400 may include a first touch electrode 501 and a second touch electrode 502 which are electrically insulated from each other.

The first touch electrode 501 may function as a transmitting electrode that transmits a signal, and the second touch electrode 502 may function as a receiving electrode that receives a signal. However, the present embodiment is not limited thereto.

The first touch electrode 501 and the second touch electrode 502 may be formed of a transparent conductive material such as indium tin oxide (ITO) or the like. In this case, since an electrical conductivity of each of the first touch electrode 501 and the second touch electrode 502 is not good, an area of each of the first touch electrode 501 and the second touch electrode 502 may be enlarged, and thus, an interval between the first touch electrode 501 and the second touch electrode 502 may be narrowed. As a result, the first touch electrode 501 and the second touch electrode 502 may overlap the bank layer 320, and moreover, may overlap the cathode 340.

On the other hand, as seen in FIG. 4, the first touch electrode 501 and the second touch electrode 502 may be formed to overlap the bank layer 320 without overlapping the cathode 340. In this case, the first touch electrode 501 and the second touch electrode 502 may be formed of a metal material which is good in electrical conductivity.

If the first touch electrode 501 and the second touch electrode 502 are formed to overlap the bank layer 320 without overlapping the cathode 340 as in FIG. 4, a distance between the cathode 340 and each of the first and second touch electrodes 501 and 502 increases in comparison with FIG. 3, and thus, a parasitic capacitance generated between the cathode 340 and each of the first and second touch electrodes 501 and 502 is more reduced.

FIGS. 5 to 8 are schematic plan views illustrating a structure of each of a bank layer 320 and a cathode 340 according to various embodiments of the present invention.

As seen in FIG. 5(a), according to an embodiment of the present invention, the bank layer 320 may be overall formed in a matrix structure on a substrate 100 to define a plurality of pixels P1 to P3. In detail, the bank layer 320 may include a first bank layer 320a arranged in a first direction (for example, a widthwise direction) and a second bank layer 320b arranged in a second direction (for example, a lengthwise direction), and a plurality of pixel (P1 to P3) areas may be defined by intersection of the first bank layer 320a and the second bank layer 320b. Therefore, the plurality of pixels P1 to P3 including a red pixel, a green pixel, and a blue pixel may each be provided in a tetragonal structure. Also, the red pixel, the green pixel, and the blue pixel may be continuously arranged in the widthwise direction or the lengthwise direction, and thus, a plurality of red pixels, a plurality of green pixels, and a plurality of blue pixels may each be arranged in a stripe type.

As seen in FIG. 5(b), according to an embodiment of the present invention, a cathode 340 may be patterned and formed on the substrate 100. The cathode 340 may include a first cathode 340a, a second cathode 340b, a third cathode 340c, and a connection electrode 340d.

The first cathode 340a may extend in the lengthwise direction to correspond to a plurality of pixels in a column where a first pixel P1 is disposed, the second cathode 340b may extend in the lengthwise direction to correspond to a plurality of pixels in a column where a second pixel P2 is disposed, and the third cathode 340c may extend in the lengthwise direction to correspond to a plurality of pixels in a column where a third pixel P3 is disposed. For example, the first cathode 340a may be formed to correspond to the plurality of red pixels arranged in a stripe type, the second cathode 340b may be formed to correspond to the plurality of green pixels arranged in a stripe type, and the third cathode 340c may be formed to correspond to the plurality of blue pixels arranged in a stripe type. In the present specification, the first to third cathodes 340a to 340c corresponding to a plurality of pixels denotes that the first to third cathodes 340a to 340c overlap a plurality of pixels and a boundary area between the plurality of pixels.

Moreover, the connection electrode 340d may be connected to each of the first cathode 340a, the second cathode 340b, and the third cathode 340c and may be formed in a non-display area of the substrate 100. In order to be connected to the connection electrode 340d, each of the first cathode 340a, the second cathode 340b, and the third cathode 340c may extend to the non-display area of the substrate 100.

The connection electrode 340d may be formed along an edge of the substrate 100, and thus, when the substrate 100 has a tetragonal structure, the connection electrode 340d may have a tetragonal frame structure.

Since the first cathode 340a, the second cathode 340b, and the third cathode 340c are connected to each other by the connection electrode 340d, the same voltage may be applied to the first cathode 340a, the second cathode 340b, and the third cathode 340c.

The first cathode 340a, the second cathode 340b, the third cathode 340c, and the connection electrode 340d may be formed of the same material and may be provided as one body.

The first cathode 340a, the second cathode 340b, and the third cathode 340c may be separated from each other with a second bank layer (320b) area therebetween, and arranged in the lengthwise direction.

Therefore, each of the first cathode 340a, the second cathode 340b, and the third cathode 340c may extend to a top of the first bank layer 320a arranged in the widthwise direction, but may not extend to a top of the second bank layer 320b arranged in the lengthwise direction.

As described above, since the cathode 340 does not extend to the top of the second bank layer 320b, a total area of the cathode 340 is reduced in proportion thereto, and particularly, an area of the cathode 340 disposed relatively close to the above-described touch electrodes 501 and 502 is reduced, thereby decreasing a parasitic capacitance between each of the touch electrodes 501 and 502 and the cathode 340.

Also, since the cathode 340 does not extend to the top of the second bank layer 320b, referring to FIG. 2, a distance D1 from a portion of the cathode 340 which does not extend to the top of the second bank layer 320b to the touch sensor 500 is longer than a distance D2 from the touch sensor 500 to a top of the bank layer 320.

A bank layer 320 according to another embodiment of the present invention illustrated in FIG. 6(a) is the same as the above-described bank layer 320 illustrated in FIG. 5(a).

As seen in FIG. 6(b), a cathode 340 according to another embodiment of the present invention may include a first cathode 340a, a second cathode 340b, a third cathode 340c, and a connection electrode 340d.

The first cathode 340a may extend in a widthwise direction to correspond to a plurality of pixels in one row, the second cathode 340b may extend in the widthwise direction to correspond to a plurality of pixels in another row, and the third cathode 340c may extend in the widthwise direction to correspond to a plurality of pixels in another row. Particularly, each of the first cathode 340a, the second cathode 340b, and the third cathode 340c may extend to a non-display area of a substrate 100.

Moreover, the connection electrode 340d may be connected to each of the first cathode 340a, the second cathode 340b, and the third cathode 340c and may be formed in a tetragonal frame structure in the non-display area of the substrate 100.

The first cathode 340a, the second cathode 340b, and the third cathode 340c may be separated from each other with a first bank layer (320a) area therebetween, and arranged in the widthwise direction. Therefore, each of the first cathode 340a, the second cathode 340b, and the third cathode 340c may extend to a top of a second bank layer 320b arranged in a lengthwise direction, but may not extend to a top of the first bank layer 320a arranged in the widthwise direction.

As described above, since the cathode 340 does not extend to the top of the first bank layer 320a, a total area of the cathode 340 is reduced in proportion thereto, and particularly, an area of the cathode 340 disposed relatively close to the above-described touch electrodes 501 and 502 is reduced, thereby decreasing a parasitic capacitance between each of the touch electrodes 501 and 502 and the cathode 340.

A bank layer 320 according to another embodiment of the present invention illustrated in FIG. 7(a) may be patterned and formed to define a pixel (P) area having a diamond structure. Therefore, the bank layer 320 may include a first bank layer 320a arranged in a zigzag type in a lengthwise direction and a second bank layer 320b arranged in the zigzag type in a widthwise direction. However, the pixel P may be provided in a pentile structure in addition to the diamond structure. That is, the bank layer 320 may be patterned and formed to define a pixel (P) area having a pentile structure.

A cathode 340 according to another embodiment of the present invention illustrated in FIG. 7(b) may include a first cathode 340a, a second cathode 340b, a third cathode 340c, and a connection electrode 340d.

The first cathode 340a may extend in the zigzag type in the lengthwise direction to correspond to a plurality of pixels P in one column, the second cathode 340b may extend in the zigzag type in the lengthwise direction to correspond to a plurality of pixels in another column, and the third cathode 340c may extend in the zigzag type in the lengthwise direction to correspond to a plurality of pixels in another column. Particularly, each of the first cathode 340a, the second cathode 340b, and the third cathode 340c may extend to a non-display area of a substrate 100.

Moreover, the connection electrode 340d may be connected to each of the first cathode 340a, the second cathode 340b, and the third cathode 340c and may be formed in a tetragonal frame structure in the non-display area of the substrate 100.

The first cathode 340a, the second cathode 340b, and the third cathode 340c may be separated from each other with a partial region of the second bank layer 320b therebetween, arranged in the zigzag type in the lengthwise direction. Therefore, each of the first cathode 340a, the second cathode 340b, and the third cathode 340c may extend to a top of the first bank layer 320a arranged in the zigzag type in the widthwise direction, but may not extend to a partial top of the second bank layer 320b arranged in the lengthwise direction. Particularly, the first cathode 340a, the second cathode 340b, and the third cathode 340c may be arranged in the zigzag type in correspondence with a plurality of pixels P having the diamond structure or the pentile structure.

As described above, since the cathode 340 does not extend to the partial top of the second bank layer 320b, a total area of the cathode 340 is reduced in proportion thereto, and particularly, an area of the cathode 340 disposed relatively close to the above-described touch electrodes 501 and 502 is reduced, thereby decreasing a parasitic capacitance between each of the touch electrodes 501 and 502 and the cathode 340.

A bank layer 320 according to another embodiment of the present invention illustrated in FIG. 8(a) is the same as the above-described bank layer 320 illustrated in FIG. 7(a).

A cathode 340 according to another embodiment of the present invention illustrated in FIG. 8(b) may be arranged in a zigzag type in a widthwise direction. The cathode 340 may extend to a non-display area of a substrate 100.

Since the cathode 340 does not extend to a partial top of a first bank layer 320a arranged in the zigzag type in the widthwise direction, a total area of the cathode 340 is reduced in proportion thereto, and particularly, an area of the cathode 340 disposed relatively close to the above-described touch electrodes 501 and 502 is reduced, thereby decreasing a parasitic capacitance between each of the touch electrodes 501 and 502 and the cathode 340.

As described above, according to various embodiments of the present invention, since the cathode 340 does not extend to a top of at least a portion of the bank layer 320, the parasitic capacitance between each of the touch electrodes 501 and 502 and the cathode 340 is reduced in comparison with the related art where the cathode 340 extends to a whole top of the bank layer 320.

Hereinabove, FIGS. 5 to 8 illustrate a structure of each of the bank layer 320 and the cathode 340 according to various embodiments of the present invention, but the bank layer 320 and the cathode 340 according to various embodiments of the present invention are not limited to the structure.

Figure 9:
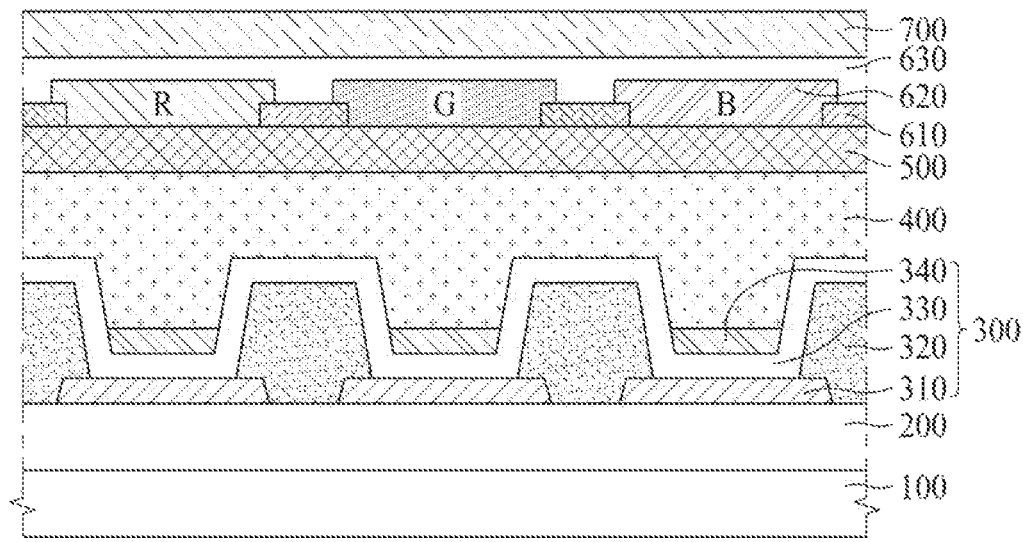
FIG. 9 is a schematic cross-sectional view of a display device according to another embodiment of the present invention.

FIG. 9 is a schematic cross-sectional view of a display device according to another embodiment of the present invention.

In the above-described display device according to an embodiment of the present invention illustrated in FIG. 2, since the touch sensor 500 is formed on a bottom of the cover film 700 on which an image is displayed, external light may be reflected by the touch electrodes 501 and 502 included in the touch sensor 500, causing degradation in image quality. In order to solve a problem where the external light is reflected by the touch electrodes 501 and 502, in the display device illustrated in FIG. 2, a polarizing film may be additionally provided between the touch sensor 500 and the cover film 700.

If the polarizing film is additionally provided, light reflected by the touch electrodes 501 and 502 included in the touch sensor 500 cannot pass through the polarizing film, thereby solving a problem where the external light is reflected. In this case, however, since the polarizing film is additionally provided, a luminance of the display device is reduced. That is, in a case where light emitted from the light emitting layer 330 of the light emitting device layer 300 passes through the polarizing film, a considerable amount of light can be blocked by the polarizing film.

FIG. 9 relates to a display device for preventing external light from being reflected by the touch electrodes 501 and 502 included in the touch sensor 500 and solving a problem where luminance is reduced.

As seen in FIG. 9, the display device according to another embodiment of the present invention may include a substrate 100, a circuit device layer 200, a light emitting device layer 300, an encapsulation layer 400, a touch sensor 500, a color filter layer 600, and a cover film 700.

The substrate 100 and the circuit device layer 200 are the same as the above-described embodiment, and thus, their repetitive descriptions are not provided.

The light emitting device layer 300 may include an anode 310, a bank layer 320, a light emitting layer 330, and a cathode 340.

The anode 310 and the bank layer 320 are the same as the above-described embodiment, and thus, their repetitive descriptions are not provided.

The light emitting layer 330 may be formed on the anode 310. The light emitting layer 330 may be provided to emit white light, and in this case, the light emitting layer 330 may be formed all over a top of the substrate 100 without being patterned or formed in each of a plurality of pixels. Therefore, the light emitting layer 330 may be formed on the bank layer 320 provided in a boundary between adjacent pixel areas. Since the display device according to another embodiment of the present invention includes the color filter layer 600, the white light emitted from the light emitting layer 330 may pass through the color filter layer 600, and thus, colored light may be emitted from each pixel.

The light emitting layer 330 emitting the white light may include a stack including a blue light emitting layer and a stack including a yellow light emitting layer, or may include a stack including a red light emitting layer, a stack including a green light emitting layer, and the stack including the blue light emitting layer. A configuration of the light emitting layer 330 may be modified into various types well known to those skilled in the art.

The cathode 340, the encapsulation layer 400, and the touch sensor 500 are as described above, and thus, their repetitive descriptions are not provided.

The color filter layer 600 may be formed on the touch sensor 500. The color filter layer 600 may include a black matrix 610, a color filter 620, and an overcoat layer 630.

The black matrix 610 may be formed in a boundary between adjacent pixels to divide an area of an individual color filter 620 provided in each pixel, thereby preventing light leakage from occurring in the boundary between the adjacent pixels. The black matrix 610 may be formed to overlap the bank layer 320.

The black matrix 610 may be provided in plurality, and the color filter 620 may be formed between adjacent black matrixes 610. The color filter 620 may include a red (R) color filter, a green (G) color filter, and a blue (B) color filter which are provided in respective pixels.

The overcoat layer 630 may be formed on the color filter 620 to planarize a surface of the substrate 100.

The cover film 700 may be formed on the color filter layer 600.

The cover film 700 may be directly adhered to the overcoat layer 630 of the color filter layer 600. In this case, since a separate transparent adhesive layer for adhering the cover film 700 cannot be used, a process is simplified, and the material cost is reduced.

According to another embodiment of the present invention, since the color filter layer 600 is disposed closer to a light emitting surface (i.e., the cover film 700) than the light emitting device layer 300, light emitted from the light emitting device layer 300 may be changed to colored light by passing through the color filter layer 600, and thus, it is possible to implement a color display device.

Particularly, according to another embodiment of the present invention, since the color filter layer 600 may be disposed closer to the light emitting surface (i.e., the cover film 700) than the touch sensor 500. That is, the touch sensor 500 may be provided between the color filter layer 600 and the light emitting device layer 300. Therefore, external light being reflected by the touch electrodes 501 and 502 configuring the touch sensor 500 can be blocked by the color filter layer 600. Accordingly, a separate anti-reflection layer such as a polarizing film may not be provided for decreasing reflection of the external light by the touch electrodes 501 and 502 configuring the touch sensor 500, thereby solving a problem where luminance is reduced by the separate anti-reflection layer.

Figure 10A:
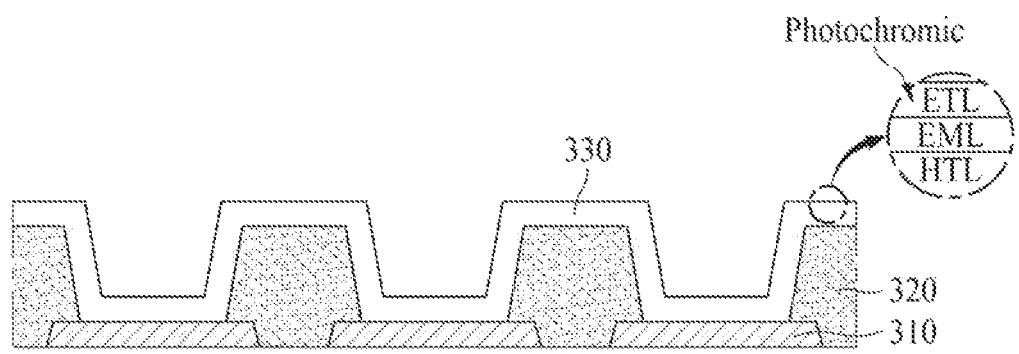
FIGS. 10A to 10C illustrate a method of forming a light emitting device layer, according to an embodiment of the present invention.
Figure 10B:
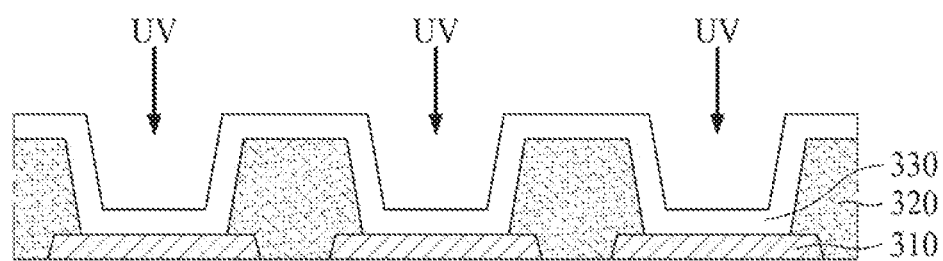
Figure 10C:
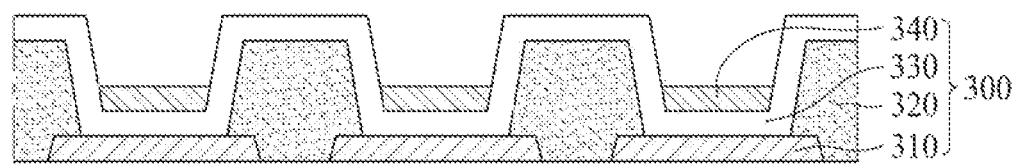

FIGS. 10A to 10C illustrate a method of forming a light emitting device layer 300 in the above-described display device of FIG. 9, according to an embodiment of the present invention and particularly, illustrates a method of pattern-forming an cathode 340 on a light emitting layer 330.

First, as seen in FIG. 10A, a bank layer 320 may be patterned and formed on an anode 310, and a light emitting layer 330 may be formed on the anode 310 and the bank layer 320.

The light emitting layer 330 may include a hole transport layer (HTL), an organic light emitting layer (EML), and an electron transport layer (ETL) which are sequentially stacked. In this case, the ETL may include a photochromic material.

Subsequently, as seen in FIG. 10B, ultraviolet (UV) may be irradiated onto a certain region of the light emitting layer 330. The certain region onto which the UV is irradiated may be a region where a below-described cathode 340 is formed. Therefore, the UV may be irradiated onto a region of the light emitting layer 330, which does not overlap the bank layer 320, without being irradiated onto another region of the light emitting layer 330 overlapping the bank layer 320.

In this case, a phase change of the photochromic material in the ETL occurs in the region onto which the UV is irradiated, and the phase change of the photochromic material does not occur in the other region onto which the UV is not irradiated.

Subsequently, as seen in FIG. 10C, the cathode 340 may be deposited on the light emitting layer 330.

The cathode 340 may be deposited without a separate mask. In this case, the cathode 340 may be formed in a region where the phase change of the photochromic material occurs due to the irradiation of the UV, and the cathode 340 may not be formed in a region where the phase change of the photochromic material does not occur.

For example, the cathode 340 may be deposited by a nucleation action in the region where the phase change of the photochromic material occurs, but the cathode 340 may not be deposited by a desorption action in the region where the phase change of the photochromic material does not occur.

In this manner, by using the nucleation action and the desorption action of the photochromic material based on the presence of UV irradiation, the cathode 340 may be patterned and formed in only a desired region without a separate mask.

As described above, if the photochromic material is included in an upper layer (for example, the ETL) of the light emitting layer 330 contacting the cathode 340, the cathode 340 may be patterned and formed without a separate mask process.

As described above, according to the embodiments of the present invention, since the cathode including the first and second cathodes separated from each other by the bank layer is patterned and formed, in comparison with the related art where the cathode is formed all over the substrate, an area of the cathode is reduced, and thus, a parasitic capacitance generated between each of the plurality of touch electrodes included in the touch sensor and the cathode is reduced, thereby preventing a performance of the touch sensor from being reduced.

Moreover, according to the embodiments of the present invention, since the cathode does not extend to the top of the bank layer, in comparison with the related art, a distance between the touch sensor and the cathode increases, and thus, a parasitic capacitance generated between each of the plurality of touch electrodes included in the touch sensor and the cathode is reduced, thereby preventing a performance of the touch sensor from being degraded.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
a substrate including a display area including a plurality of pixels and a non-display area provided outside of the display area;
an anode in each of the plurality of pixels;
a bank layer provided to define the plurality of pixels, the bank layer comprising a first bank layer, and a second bank layer;
a light emitting layer on the anode;
a continuous electrode layer arranged as a connection electrode in the non-display area and as a plurality of cathodes in the display area,
the continuous electrode layer including a plurality of zigzag type openings corresponding to an extending direction of the first bank layer or the second bank layer;
an encapsulation layer on the plurality of cathodes; and
a touch sensor including a plurality of touch electrodes on the encapsulation layer, wherein at least a portion of the plurality of touch electrodes overlaps the plurality of zigzag type openings.

2. The display device of claim 1, further comprising a color filter layer including a black matrix, a plurality of color filters and an overcoat layer on an upper surface of the touch sensor.

3. The display device of claim 2, wherein
the black matrix is provided between the plurality of color filters, and
boundaries between adjacent color filters are located at an upper surface of the black matrix.

4. The display device of claim 1, wherein the light emitting layer is provided in an entire area of the display area, and an upper surface of the light emitting layer is in contact with a lower surface of the encapsulation layer in the area overlapping at least a portion of the bank layer.

5. The display device of claim 1, wherein the light emitting layer includes a hole transporting layer, an organic emitting layer on the hole transporting layer, and an electron transporting layer on the organic emitting layer, and the electron transporting layer includes a photochromic material.

6. The display device of claim 5, wherein
a phase of the photochromic material included in the electron transporting layer in an area where the electron transporting layer contacts a lower surface of a corresponding cathode among the plurality of cathodes is different from a phase of the photochromic material included in the electron transporting layer in an area where the electron transporting layer contacts a lower surface of the encapsulating layer.

* * * * *